(12) United States Patent
Sanchez et al.

(10) Patent No.: US 7,183,817 B2
(45) Date of Patent: Feb. 27, 2007

(54) HIGH SPEED OUTPUT BUFFER WITH AC-COUPLED LEVEL SHIFT AND DC LEVEL DETECTION AND CORRECTION

(75) Inventors: Hector Sanchez, Cedar Park, TX (US); Xinghai Tang, Cedar Park, TX (US); Carlos A. Greaves, Austin, TX (US); Jim P. Nissen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 79 days.

(21) Appl. No.: 11/169,862

(22) Filed: Jun. 29, 2005

(65) Prior Publication Data

US 2007/0001716 A1  Jan. 4, 2007

(51) Int. Cl.
*H03K 3/00* (2006.01)
(52) U.S. Cl. ..................... 327/112; 327/333
(58) Field of Classification Search ............... 327/112, 327/333, 108; 326/82–83
See application file for complete search history.

(56) References Cited

U.S. PATENT DOCUMENTS

| | | | |
|---|---|---|---|
| 5,113,097 A | 5/1992 | Lee | 326/81 |
| 5,440,258 A * | 8/1995 | Galbi et al. | 327/112 |
| 5,450,357 A | 9/1995 | Coffman | 365/189.11 |
| 5,650,742 A | 7/1997 | Hirano | 327/333 |
| 5,698,993 A | 12/1997 | Chow | 326/81 |
| 5,796,313 A | 8/1998 | Eitan | 331/51 |
| 5,808,480 A | 9/1998 | Morris | 326/81 |
| 6,242,962 B1 | 6/2001 | Nakamura | 327/333 |
| 6,400,206 B2 | 6/2002 | Kim et al. | 327/333 |
| 6,414,534 B1 | 7/2002 | Wang et al. | 327/333 |

(Continued)

FOREIGN PATENT DOCUMENTS

EP  0 817 385 A1  1/1998

(Continued)

OTHER PUBLICATIONS

A high-voltage output driver in a standard 2.5 V 0.25 um CMOS technology; Serneels, B.; Piessens, T.; Stepert, M. Dehaene, W.; Solid-State Circuits Conference, 2004. Digest of Technical Papers. ISSCC. 2004 IEEE International, Feb. 15-19, 2004 pp. 146-518 vol. 1.

(Continued)

*Primary Examiner*—Quan Tra
(74) *Attorney, Agent, or Firm*—Gary R. Stanford

(57) ABSTRACT

A high speed output buffer including an input circuit providing first and second signals within a first voltage range having a first common mode voltage, an AC interface receiving the first and second signals and providing first and second preliminary drive signals, a detection and correction circuit that corrects a state of the first preliminary drive signal AC coupled to the first signal, first and second drive circuits receiving the preliminary drive signals and providing first and second drive signals, where the first drive circuit operates within a second voltage range having a greater common mode voltage and where the second drive circuit operates within a third voltage range, and an output that switches an output node within a voltage range that is greater than a maximum voltage range. The first, second and third voltage ranges are each within the maximum voltage range suitable for thin-gate devices.

20 Claims, 6 Drawing Sheets

U.S. PATENT DOCUMENTS

| | | | |
|---|---|---|---|
| 6,456,110 B1 | 9/2002 | Elamanchili et al. | 326/68 |
| 6,483,366 B2 | 11/2002 | Ho | 327/333 |
| 6,489,828 B1 | 12/2002 | Wang et al. | 327/333 |
| 6,556,061 B1 | 4/2003 | Chen et al. | 327/333 |
| 6,586,974 B1 * | 7/2003 | Humphrey et al. | 327/108 |
| 6,672,769 B2 | 1/2004 | Toda et al. | 384/554 |
| 6,696,860 B2 * | 2/2004 | Lim et al. | 326/83 |
| 6,696,878 B1 | 2/2004 | Haskin | 327/333 |
| 6,774,696 B2 | 8/2004 | Clark et al. | 327/333 |
| 6,803,801 B2 | 10/2004 | Randazzo et al. | 327/333 |
| 6,819,159 B1 | 11/2004 | Lencioni | 327/333 |
| 6,903,588 B2 * | 6/2005 | Vorenkamp | 327/170 |
| 2001/0011917 A1 | 8/2001 | Kim et al. | 327/333 |
| 2001/0043092 A1 | 11/2001 | McDaniel | 327/108 |
| 2002/0080651 A1 | 6/2002 | Tanzawa et al. | 365/185.18 |
| 2002/0084802 A1 | 7/2002 | Elamanchili et al. | 326/68 |
| 2002/0190776 A1 | 12/2002 | Wang et al. | 327/333 |
| 2003/0107425 A1 | 6/2003 | Yushan | 327/333 |
| 2003/0173994 A1 | 9/2003 | Lai et al. | 326/81 |
| 2004/0217798 A1 | 11/2004 | Lencioni | 327/333 |
| 2005/0012537 A1 | 1/2005 | Lee | 327/333 |
| 2005/0040852 A1 | 2/2005 | Mentze et al. | 326/81 |
| 2005/0040854 A1 | 2/2005 | Mentze et al. | 326/81 |

FOREIGN PATENT DOCUMENTS

| | | |
|---|---|---|
| EP | 0817 387 A1 | 1/1998 |
| EP | 0880 230 A2 | 11/1998 |
| EP | 0 884 849 A2 | 12/1998 |
| EP | 0 886 379 A1 | 12/1998 |
| JP | 2002290230 | 10/2004 |

OTHER PUBLICATIONS

High-voltage-tolerant I/O buffers with low-voltage CMOS process; Singh, G.P.; Salem, R.B.' Solid-State Circuits, IEEE Journal of, vol. 34, Issue: 11, Nov. 1999 pp. 1512-1525.

An 8-Gb/s Capacitively Coupled Receiver With High Common-Mode Rejection for Uncoded Data; Maillard, X.; Kuijk, M.; Solid-State Circuits, IEEE Journal of , vol. 39, Issue: 11, Nov. 2004 pp. 1909-1915.

A low voltage to high voltage level shifter circuit for MEMS application; Pan, D.; Li, H.W.; Wilamowski, B.M.; University/Government/Industry Microelectronics Sumposium, 2003.. Proceedings of the 15th Biennial, Jun. 30-Jul. 2003 pp. 128-131.

Low power CMOS level shifters by bootstrapping technique; Tan, S.C.; Sun, X.W.; Electronics Letters, vol. 38, Issue: 16, Aug. 1, 2002; pp. 876-878.

Level shifters for high-speed 1V to 303 V interfaces in a 0.13 pm Cu-interconnection/low-k CMOS technology; Wen-Tai Wang; Ming-Dou Ker; Mi-Chang; Chung-Hui Chen; VLSI Technology, Systems, and Application, 2001. Proceedings of Technical Papers. 2001 International Suymposium on, Apr. 18-20, 2001 pp. 307-310.

A low voltage to high voltage level shifter in a low voltage, 0.25/spl mu/m PD DOI process; Mentze, E.J.; Buck, K.M.; Hess, H.L.; Cox, D.; Mojarradi, M.; VLSI, 2004. Proceedings. IEEE Computer society Annual Symposium on, Feb. 19-20, 2004 pp. 218-221.

A CMOS PLL Using Current-Adjustable Charge-Pump and On-Chip Loop Filter with Initialization Circuit Zhao-Hui, Ren Jonuan, Zhang Qianling, ASIC and System State Key Lab, Fudan University, 200433, P.R. China pp. 728-731.

* cited by examiner

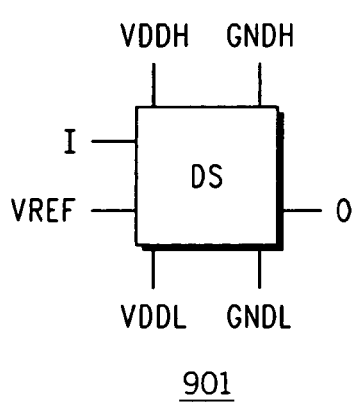
FIG. 9
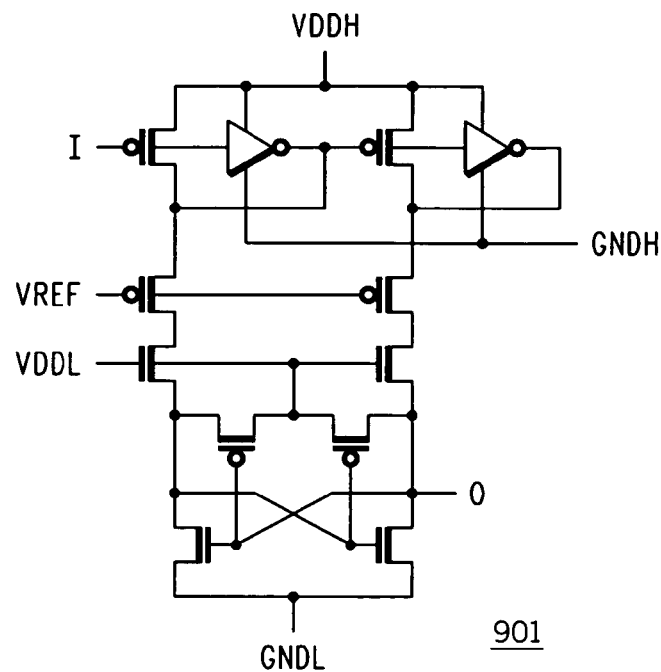
FIG. 10
FIG. 11
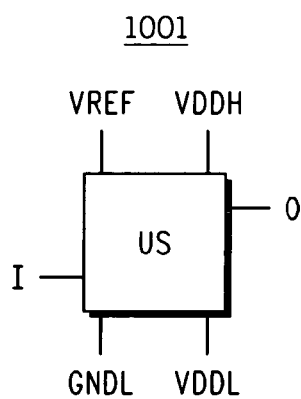
FIG. 12
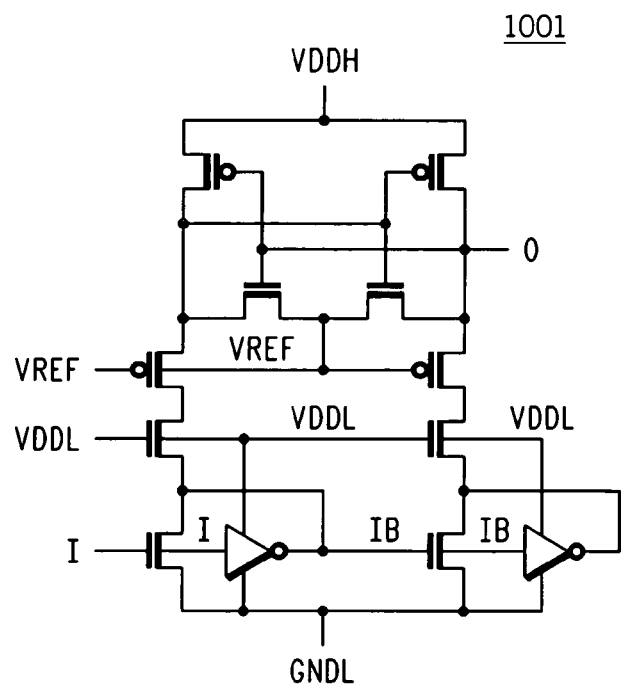

HIGH SPEED OUTPUT BUFFER WITH AC-COUPLED LEVEL SHIFT AND DC LEVEL DETECTION AND CORRECTION

BACKGROUND OF THE INVENTION

1. Field of the Invention

The present invention relates in general to electronic devices, and more specifically to a high speed output driver with internal AC-coupled level shift and DC level detection and correction.

2. Description of the Related Art

Process technologies, including CMOS processes, are continually improving resulting in smaller and faster devices, such as, for example, 90-nm (nanometer) CMOS. Yet many systems include circuitry designed with a variety of technologies operating at multiple voltage levels. There exists the need for high-speed, point-to-point interface communications between lower chip level signals, e.g., 1 Volt (V), and external circuits operating at higher voltage levels (e.g., 2.5V, 3.3V, etc). Current Input/Output (I/O) architectures rely on higher voltage, thick gate-oxide devices (e.g., Dual-Gate Oxide (DGO) devices and the like) to implement output drivers for safe operation, yet such drivers suffer from low performance particularly at lower voltage levels of the chip. The process provides thin gate-oxide devices, which are smaller and significantly faster yet unable to withstand the higher voltage levels. The conventional approach is to construct output buffers with a combination of thin gate-oxide (hereinafter "thin-gate") and thick gate-oxide (hereinafter "thick-gate") devices in an attempt to achieve a desired level of performance while isolating the thin-gate devices from external supply voltages. It has proved to be very challenging to provide an output buffer that interfaces multiple voltage levels while operating at the desired limits of the I/O speed.

It is appreciated that the terms "thin" and "thick" are relative and that the actual thicknesses depend on the particular process technology and voltage levels employed. As used herein, the term "thin-gate" refers to thin gate-oxide devices that are suitable for the lower voltage ranges but that would break down if exposed to higher voltage levels. The term "thick-gate" refers to thick gate-oxide devices that are capable of being exposed to the higher voltage ranges. In the more specific embodiments illustrated herein, the lower voltage range is up to 1.2 V whereas the higher or full voltage range is between ground (0 V) and 3.3–3.6 V. It is understood, however, that the particular voltage levels and values are arbitrary and may change over time, such that what is now called "thin" may be considered "thick" by tomorrow's standards. The present invention transcends the particular voltage levels and ranges in that the configuration allows the lower voltage or thin-gate devices to be used to switch higher voltage levels which would otherwise require higher voltage devices.

It is desired to implement a high speed output buffer between lower level chip voltages and higher voltage peripheral components and circuits.

BRIEF DESCRIPTION OF THE DRAWINGS

The benefits, features, and advantages of the present invention will become better understood with regard to the following description, and accompanying drawing in which:

FIGS. 9 and 10 are diagrams illustrating an exemplary down shift or DS circuit which may be used as any of the DS circuits of FIG. 8; and FIGS. 11 and 12 are diagrams illustrating an exemplary up shift or US circuit which may be used as any of the US circuits of FIG. 8.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
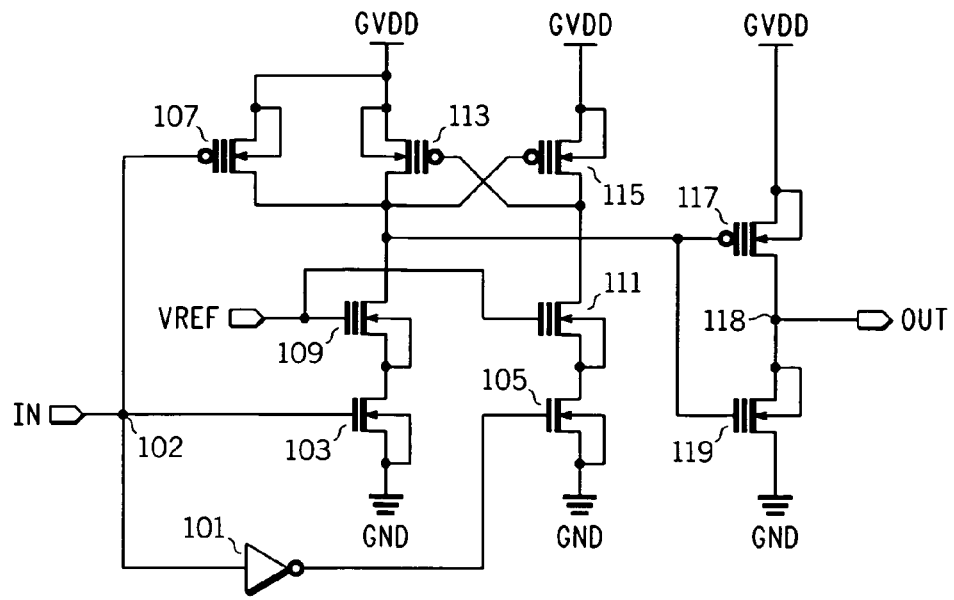
FIG. 1 is a schematic diagram of a level shifter implemented using CMOS technology according to prior art which level shifts a lower input voltage to a higher output voltage suitable for a conventional pre-driver circuit.

FIG. 1 is a schematic diagram of a level shifter 100 implemented using CMOS technology according to prior art which level shifts a lower input voltage to a higher output voltage suitable for a conventional pre-driver circuit (not shown). An input signal IN is provided to an input node 102, which is coupled to the input of an inverter 101, to the gate of an N-channel transistor 103 and to the gate of a P-channel transistor 107. The output of inverter 101 is coupled to the gate of an N-channel transistor 105, and the sources of transistors 103 and 105 are coupled to ground (GND). The drains of transistors 103 and 105 are coupled to the respective sources of a pair of N-channel transistors 109 and 111, each receiving a reference voltage VREF at their gates. The drain of transistor 109 is coupled to the drain of transistor 107, to the drain of a P-channel transistor 113 and to the gate of another P-channel transistor 115. The drain of transistor 111 is coupled to the drain of transistor 115 and to the gate of transistor 113. The sources of transistors 107, 113 and 115 are coupled to an upper supply voltage GVDD, which has a relatively high voltage level, such as 3.3 V for enabling higher voltage devices. The drain of transistor 109 is coupled to the gates of a P-channel transistor 117 and an N-channel transistor 119. The source of transistor 117 is coupled to GVDD and its drain is coupled to an output node 118 providing an output signal OUT. Node 118 is coupled to the drain of transistor 119, having its source coupled to GND.

The transistors 103 and 105 and the inverter 101 are thin-gate devices, whereas the remaining transistors 107, 109, 111, 113, 115, 117 and 119 are thick-gate devices. The IN signal and the devices 101, 103 and 105 operate within a lower voltage range between a lower supply voltage VDD (e.g., up to 1.5V) and GND. The OUT signal and the thick-gate devices operate within a higher differential voltage range between a supply voltage GVDD and GND. VREF is scaled to an intermediate voltage level to limit the maximum voltage applied across the thin-gate devices. The thick-gate devices protect the lower voltage devices but are placed in the signal path and therefore limit speed performance from input to output. The speed from input to output is on the order of 300 to 400 picoseconds (ps).

The level shifter 100 is the initial stage of an output buffer which drives an output signal at a higher voltage level. The level shifter 100 effectively increases the common mode of the input signal to a signal having a voltage level suitable for an output stage, where the level-shifted signal is then provided to the input of a pre-driver circuit used to boost the signal strength of the signal to drive an output stage. The output stage also switches within the higher voltage range, and thus is implemented with the slower thick-gate devices. Thus, an output buffer implemented with the conventional compromise of both thick-gate and thin-gate devices inserts a significant amount of delay from input to output. In an alternative approach, a series of thin-oxide devices are stacked together in a cascaded configuration, each upper level at a higher voltage level than the last. This approach is very complex and requires a complicated set of reference voltages to ensure protection of each low voltage device in the stacked configuration. Although somewhat faster, the stack of thin-gate devices tends to slow throughput from input to output, resulting in a throughput speed on the order of 200 to 300 ps.

Figure 2:
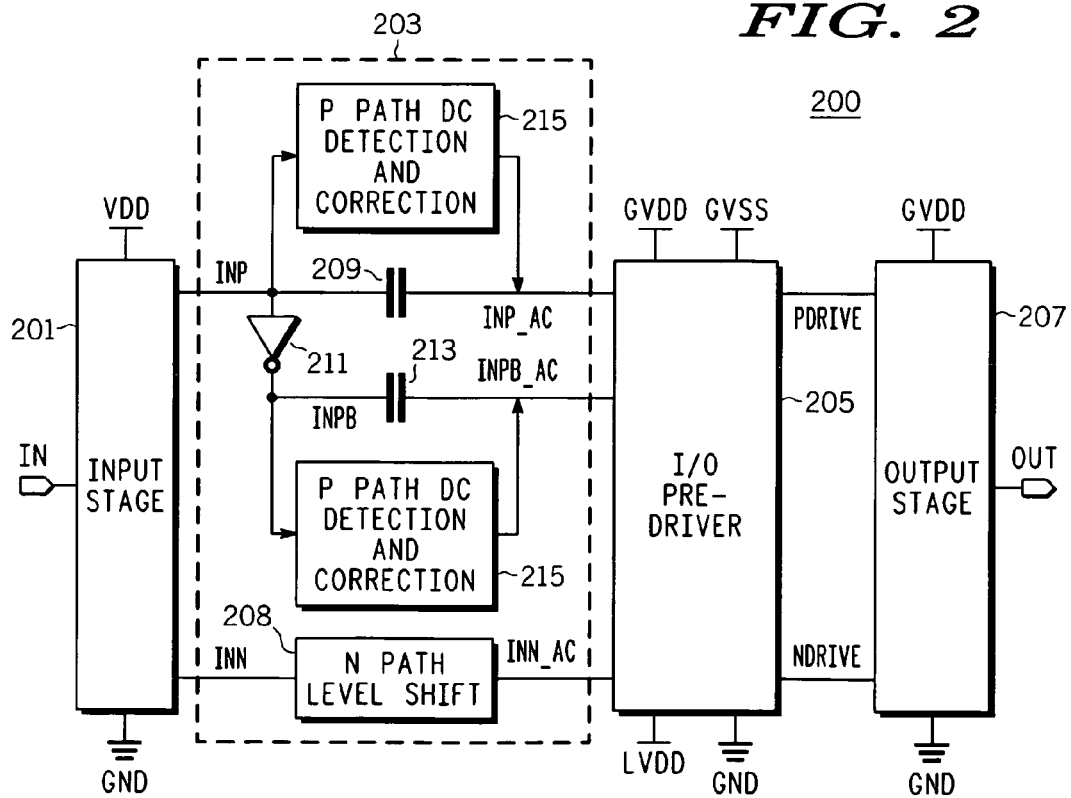
FIG. 2 is a schematic and block diagram of an output buffer implemented according to an exemplary embodiment of the present invention including non-feedback DC bias level detection and correction.

FIG. 2 is a schematic and block diagram of an output buffer 200 implemented according to an exemplary embodiment of the present invention including non-feedback DC bias level detection and correction. The input signal IN is provided to an input stage 201 operating within a low differential voltage range between the lower voltage level VDD and GND, where the input stage 201 provides a P path input signal INP and an N path input signal INN to an AC interface 203. The INN and INP signals both switch within the differential voltage range of VDD and GND. The AC interface 203 is coupled to an I/O pre-driver 205, which includes a P path 503 (FIG. 5) generating a P path drive signal PDRIVE and an N path 504 (FIG. 5) generating an N path drive signal NDRIVE. The PDRIVE and NDRIVE signals are provided to respective inputs of an output stage 207, which operates in the high differential voltage range between GVDD and GND and which develops an output signal OUT that switches within the high differential voltage range between GVDD and GND. The P path 503 operates in a differential voltage range between GVDD and another supply voltage GVSS and the N path operates in a differential voltage range between yet another supply voltage LVDD and GND. The input differential voltage range (VDD/GND), the N path differential voltage range (LVDD/GND) and the P path differential voltage range (GVDD/GVSS) are each within a predetermined maximum differential voltage range suitable for a single thin-gate device. This means that each thin-gate device may be exposed to the full differential voltage range of the operable path without being damaged or destroyed. This does not mean, however, that the differential voltage ranges of the input stage 201, the P path and the N path are exactly the same, although they may be the same if desired. The differential voltage ranges of the input stage 201, the P path and the N path are sufficiently large to enable proper switching operation of thin-gate devices yet sufficiently low to avoid exceeding the maximum voltage differential that would otherwise cause damage to the thin-gate devices.

In one embodiment, GVSS and LVDD are voltages that are scaled with respect to GVDD and GND, respectively, so as to insure that the resulting differential voltage GVDD to GVSS and LVDD to GND are such that thin-gate devices can operate optimally and reliably. The differential voltage of the input signal, VDD to GND, is nominally, but not necessarily equal to the differential signal of the P path (GVDD to GVSS) and the differential signal of the N path (LVDD to GND). In addition, the differential voltage of the P path can differ from that of the N path to allow the designer to match the speeds of both paths to compensate for differences between the paths. For example, voltage dependent junction capacitance is different for the P path than for the N path since the common mode voltage of GVDD/GVSS is significantly larger than the common mode voltage of LVDD/GND. In one embodiment GVDD is at a relatively high voltage level, such as 2.5V or 3.3V or the like, whereas VDD is at a relatively low voltage level, such 1V or 1.2V.

In one embodiment, GVDD operates at 3.3V up to 3.6V and GVSS is 2.6V to provide a 1V voltage differential. Also, LVDD is 1V up to 1.1V and GND is at zero volts, so that its voltage differential is just over 1V. And VDD is 1.2V up to 1.4V maximum for a voltage differential relative to GND of about 1.4V. All of these voltage ranges are within the maximum voltage range suitable for thin-gate devices.

The input stage 201 includes the appropriate logic (not shown) to switch the INP and INN signals to the desired logic levels, which same logic levels are conveyed through the AC interface 203 and the I/O pre-driver 205 to the PDRIVE and NDRIVE signals to drive the output stage 207. When IN is asserted high, the INP and INN signals are both asserted low so that both PDRIVE and NDRIVE are both driven low via the AC interface 203 and the I/O pre-driver 205. When IN is asserted low, the INP and INN signals are both asserted high so that both PDRIVE and NDRIVE are both driven high via the AC interface 203 and the I/O pre-driver 205. The AC interface 203 enhances switching speed and the I/O pre-driver 205 includes thin-gate buildup stages as further described below to drive the devices of the output stage 207 at higher power levels.

The INN signal is provided to the input of an N path level shift circuit 208, having an output providing a corresponding N path signal INN_AC to an input of the I/O pre-driver 205. The INN signal is operative at the VDD voltage level and thus switches between GND and VDD. The I/O pre-driver 205 includes a series of N path buildup devices that operate at a slightly different voltage level LVDD. In one embodiment, LVDD is slightly higher than VDD, such as a step up of 1V to 1.2V. In another embodiment, VDD is slightly higher, such as 1.2V, whereas LVDD is 1V. In either case, the N path level shift circuit 208 shifts the voltage level of the INN signal operative at VDD to the voltage level of the INN_AC signal operative at LVDD. Since the voltages VDD and LVDD are sufficiently close, they are both considered to be operating within the differential voltage range of the N and P paths to allow the use of thin-gate devices in either.

Figure 3:
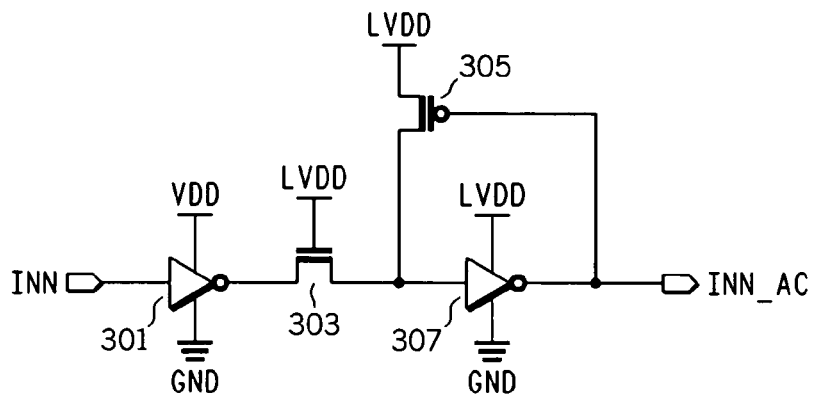
FIG. 3 is a more detailed schematic diagram of the N path level shift circuit of FIG. 2 configured in a conventional manner.

FIG. 3 is a more detailed schematic diagram of the N path level shift circuit 208 configured in a conventional manner. In this embodiment, since there is a relatively small voltage differential, the voltage shift is implemented without a capacitor interface so that the INN_AC signal is only AC in name rather than function. As shown, the INN signal is provided to the input of an inverter 301 operative between VDD and GND. The output of the inverter 301 is provided to one current terminal (drain or source) of an N-channel transistor 303, having its other current terminal (source or drain) provided to the drain of a P-channel transistor 305 and to the input of another inverter 307 operative between LVDD and GND. The source of the transistor 305 and the gate of the transistor 303 are coupled to LVDD and the output of the inverter 307 provides the INN_AC signal, which is provided to the gate of the transistor 305. In operation, the output of the inverter 301 switches between VDD and GND and the input of the inverter 307 switches between LVDD and GND. The transistor 303 is a pass device inserting a resistance between the output of the inverter 301 and the input of the inverter 307 to allow for the voltage shift. For a step up in voltage (LVDD>VDD), the transistor 305 operates as a pull-up device to pull the input of the inverter 307 all the way to LVDD since the output of the inverter 301 only goes as high as VDD. For a step down in voltage (VDD>LVDD), the transistor 305 clamps the input of the inverter 307 to LVDD when the output of the inverter 301 is asserted high to VDD. In either case, the INN signal switches up to VDD whereas the INN_AC signal switches up to LVDD. It is appreciated that the level shift circuit 208 operates to convert from one relatively low differential voltage range to another, where both are within the maximum voltage range suitable for a single thin-gate device.

Referring back to FIG. 2, the INP signal is provided to one terminal of a capacitor 209, having its other terminal developing a signal INP_AC provided to one P path input of the I/O pre-driver 205. The INP signal is also provided to the input of an inverter 211, having an output developing an inverted version of INP, referred to as INPB. A "B" appended to a signal name generally denotes logical negation or inversion unless otherwise specified. The INPB signal is provided to one terminal of another capacitor 213, having its other terminal developing a signal INPB_AC provided to another P path input of the I/O pre-driver 205. Since the voltage across a capacitor does not change instantaneously, the AC interface 203 provides a fast interface from the output of the input stage 201, operative up to VDD, to the input of the I/O pre-driver 205, operative up to GVDD, in response to signal transitions. Yet the DC state of a capacitor may be or may become indeterminate, such as during initialization (e.g., startup, reset, power-up, etc.) or during periods when no data is transmitted. A P path DC detection and correction circuit 215 is provided having an input coupled to one terminal of the capacitor 209 and receiving the INP signal and an output coupled to the other terminal of the capacitor 209 for correcting the state of the INP_AC signal if for any reason it is not in the correct state. Another P path DC detection and correction circuit 215 is provided having an input coupled to one terminal of the capacitor 213 and receiving the INPB signal and an output coupled to the other terminal of the capacitor 213 for correcting the state of the INPB_AC signal if necessary.

Figure 4:
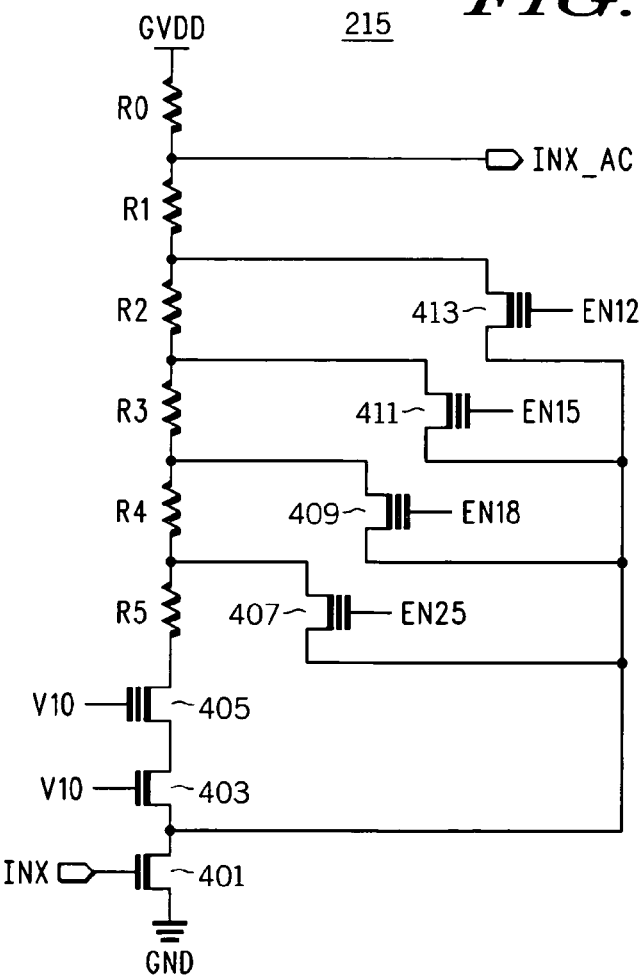
FIG. 4 is a schematic diagram of the P path DC detection and correction circuit of FIG. 2 according to an exemplary embodiment of the present invention.

FIG. 4 is a schematic diagram of the P path DC detection and correction circuit 215 according to an exemplary embodiment of the present invention. An input signal INX is provided to the gate of an N-channel transistor 401 having its source coupled to GND. The INX signal represents either the INP signal or the INPB signal depending upon where the P path DC detection and correction circuit 215 is coupled, since both operate in substantially the same manner. The drain of transistor 401 is coupled to the source of another N-channel transistor 403, having its source coupled to the drain of another N-channel transistor 405. A resistor R0 is coupled to GVDD and is the first of a stack of six series-coupled resistors R0–R5 coupled between GVDD and the drain of transistor 405. A set of N-channel enable transistors 407, 409, 411 and 413 each have their sources coupled to the drain of transistor 401. The drain of 407 is coupled to the junction between resistors R5 and R4, the drain of 409 is coupled to the junction between resistors R4 and R3, the drain of 411 is coupled to the junction between resistors R3 and R2, and the drain of 413 is coupled to the junction between resistors R2 and R1. An output signal INX_AC is developed at the intermediate junction between the resistors R0 and R1, and represents either the INP_AC or INPB_AC signal depending upon where the P path DC detection and correction circuit 215 is coupled. The gates of 403 and 405 receive a reference voltage V10. As further described below, the V10 voltage is one of several scaled and programmable voltages having a voltage level dependent upon the voltage level of GVDD. For example, if GVDD is 3.3V, then V10 has a voltage of 1V. The gate of 407 receives an enable signal EN25 which is asserted high when GVDD is 2.5V, the gate of 409 receives an enable signal EN18 which is asserted high when GVDD is 1.8V, the gate of 411 receives an enable signal EN15 which is asserted high when GVDD is 1.5V, and the gate of 413 receives an enable signal EN12 which is asserted high when GVDD is 1.2V. The transistors 401 and 403 are thin-gate devices, whereas the remaining transistors 405, 407, 409, 411 and 413 are thick-gate devices.

In operation of the P path DC detection and correction circuit 215, the enable signal corresponding to the voltage of GVDD is asserted high. For example, EN12 is asserted high turning on 413 if GVDD is 1.2V, EN15 is asserted high turning on 411 if GVDD is 1.5V, EN18 is asserted high turning on 409 of GVDD is 1.8V, and EN25 is asserted high turning on 407 if GVDD is 2.5V. None of the enable signals EN25, EN18, EN15 and EN12 are asserted high when GVDD is 3.3V. If INX is asserted high, then transistor 401 is turned on grounding its drain, and the transistors 403 and 405 are turned on effectively grounding the lower end of resistor R5. The transistor 405 is a thick-gate device to protect the transistor 401 and 403 from higher voltage levels, such as 3.3V levels. For any given voltage level of GVDD, the INX_AC signal is pulled high almost to the level of GVDD when INX is high. When INX is asserted low, the state of the INX_AC signal is undeterminate. Since there are two P path DC detection and correction circuits 215 receiving complementary signals NP and INPB, however, either the INP_AC or the INPB_AC signal is pulled high to the correct state if the other is at the incorrect logic state, so that the logic states of the INP_AC and INPB_AC signals are both corrected based on the states of INP and INPB.

The P path DC detection and correction circuit 215 generally operates as a resistive voltage divider that pulls the INX_AC signal towards the voltage level of GVDD regardless of the actual operating voltage level of GVDD. The switches 407, 409, 411 and 413 provide programmability to correct the state of INX_AC when INX is asserted high for GVDD at any one of multiple voltage levels. In one embodiment, GVDD is fixed at a specific voltage operating range and not changed during operation. Yet the voltage level of GVDD is programmable so that the same component may be used in different electronic devices for different markets. In another embodiment, GVDD may be programmed at any time or even dynamically programmed during operation. Dynamic programming of operating voltage is useful, for example, to enable various low power states (e.g., standby, hibernation, etc.) when the power needs are reduced and to enable switching back to full power state when power needs are greater.

Figure 5:
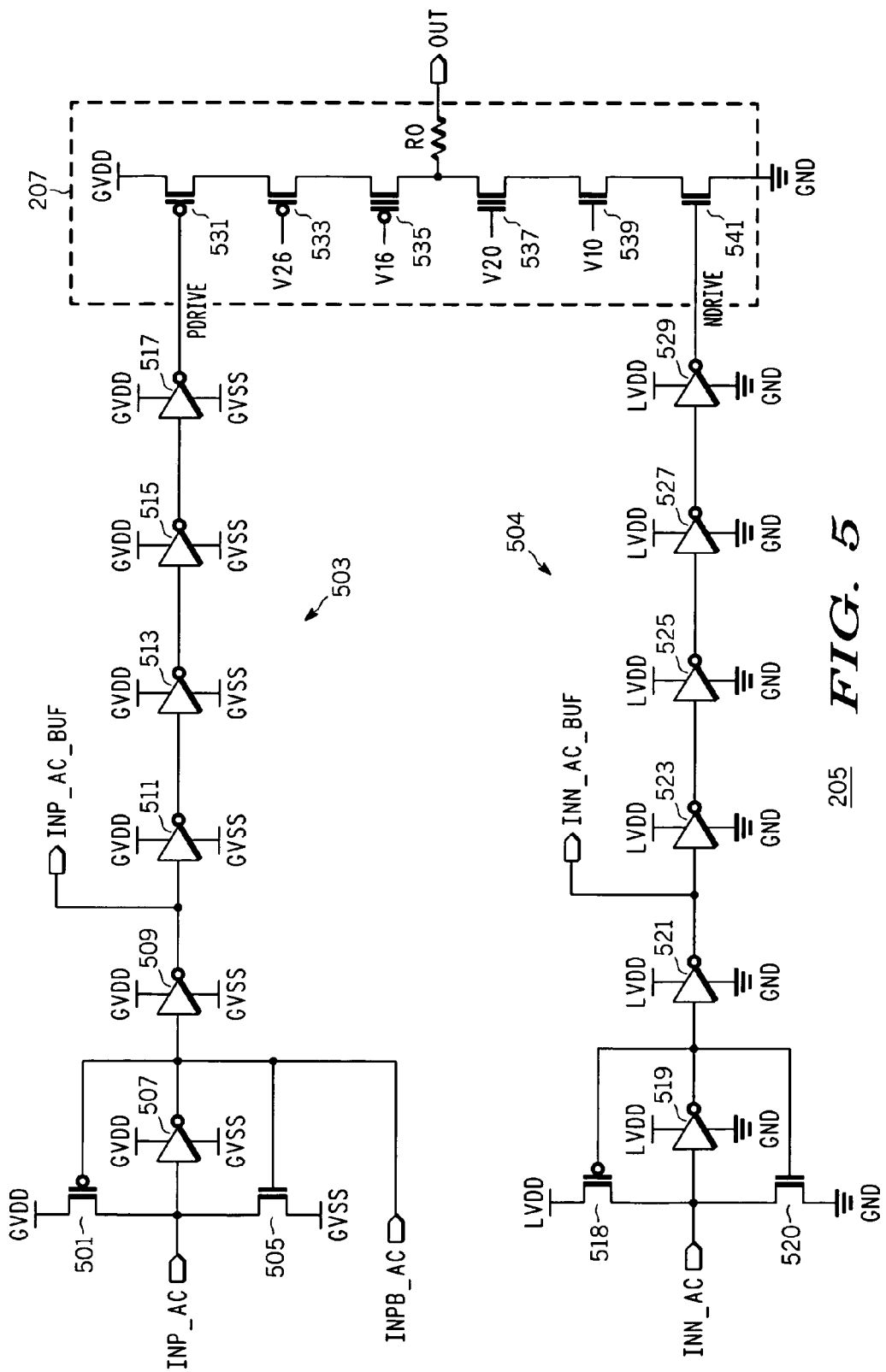
FIG. 5 is a schematic diagram of the I/O pre-driver coupled to the output driver of FIG. 2, each implemented according to exemplary embodiments of the present invention.

FIG. 5 is a schematic diagram of the I/O pre-driver 205 and the output driver 207, each implemented according to exemplary embodiments of the present invention. For the P path 503, the INP_AC signal is provided to the input of an inverter 507, to the drain of a P-channel transistor 501 and to the drain of an N-channel transistor 505. The source of transistor 501 is coupled to GVDD. The source of transistor 505 is coupled to GVSS, which has a scalable and programmable voltage level based on GVDD so that the voltage difference between the two remains at a suitable level for single thin-gate devices. In one embodiment, GVSS is 2.6V when GVDD is 3.3V. The output of inverter 507 is coupled to the gates of transistors 501 and 505 and this node receives the INPB_AC signal from the AC interface 203. The inverter 507 is the first of a set of six inverters 507, 509, 511, 513, 515 and 517 coupled in series in which the output of the last inverter 517 provides the PDRIVE signal. The series-coupled inverters 507–517 are each referenced between GVDD and GVSS and perform the buildup ratio from input to output to drive a P-channel transistor 531 of the output stage 207. The transistors 501 and 505 form a latch to keep the state of the INP_AC signal after switching. Thus, when INP_AC goes high and the output of the inverter 507 goes low, the transistor 501 is turned on to pull INP_AC high to the level of GVDD. And when INP_AC goes low and the output of the inverter 507 goes high, the transistor 505 is turned on to pull the INP_AC signal low to the level of GVSS. The output of the second inverter 509 in the P path buildup chain develops a signal INP_AC_BUF, which is a buffered version of the INP_AC signal. The initial inverters 507 and 509 of the P path collectively form a buffer with input INP_AC and output INP_AC_BUF.

For the N path 504, the INN_AC signal is provided to the input of an inverter 519 and to the drains of a P-channel transistor 518 and an N-channel transistor 520. The source of 518 is coupled to LVDD and the source of 520 is coupled to GND. The inverter 519 is the first of a set of six inverters 519, 521, 523, 525, 527 and 529 coupled in series in which the output of the last inverter 529 provides the NDRIVE signal. The series-coupled inverters 519–529 are each referenced between LVDD and GND and perform the buildup ratio from input to output to drive an N-channel transistor 541 of the output stage 207. The output of the second inverter 521 in the N-channel buildup chain develops a signal INN_AC_BUF which is a buffered version of the INN_AC signal. The initial inverters 519 and 521 of the N path collectively form a buffer with input INN_AC and output INP_AC_BUF. The transistors 518 and 520 form a latch to keep the state of the INN_AC signal. Thus, when INN_AC goes high and the output of the inverter 519 goes low, the transistor 518 is turned on to pull INN_AC high to the level of LVDD. And when INN_AC goes low and the output of the inverter 519 goes high, the transistor 520 is turned on to pull the INN_AC signal low to GND.

Since the inverters and the transistors of the P path 503 are all operated within the voltage differential GVDD/GVSS, they may be implemented with thin-gate devices. This is true regardless of the actual voltage level of GVDD, since GVSS is adjusted accordingly to maintain a maximum differential voltage range suitable for such thin-gate devices. The same is true for the inverters and the transistors of the N path 504, since operated within the voltage differential LVDD/GND. This allows the PDRIVE signal to be driven within the voltage range of GVDD/GVSS and the NDRIVE signal to be driven within the voltage range of LVDD/GND, so that the output stage 207 may operate within the relatively large voltage differential between GVDD and GND.

The output stage 207 includes the transistor 531 having its source coupled to GVDD and its drain coupled to the source of another P-channel transistor 533. The drain of 533 is coupled to the source of another P-channel transistor 535, having its drain coupled to one end of an output resistor RO and to the drain of an N-channel transistor 537. The other end of the resistor RO develops the output signal OUT. The source of 537 is coupled to the drain of an N-channel transistor 539, having its source coupled to the drain of an N-channel transistor 541. The source of 541 is coupled to GND. The PDRIVE signal is provided to the gate of 531 and the NDRIVE signal is provided to the gate of 541. A reference voltage V26 signal is provided to the gate of 533, a reference voltage V16 is provided to the gate of 535, a reference voltage V20 is provided to the gate of 537, and the reference voltage V10 is provided to the gate of 539. In the output stage 207, the transistors 531, 533, 539 and 541 are thin-gate devices whereas only the transistors 535 and 537 are thick-gate transistors. The actual voltage levels of the reference voltages V10, V20, V16 and V26 are programmable and scalable to voltage levels that protect the transistors 531, 533, 539 and 541 as understood by those skilled in the art. These voltages are also scalable to achieve speed matching optimization between the P and N paths 503 and 504. In one embodiment, for example, when GVDD is 3.3V, the voltages V10, V20, V16 and V26 are 1V, 2V, 1.6V and 2.6V, respectively. In another embodiment, these reference voltages are programmed and scaled based on the operating voltage level of GVDD.

The PDRIVE and NDRIVE signals are both asserted low to pull the OUT signal high, and are both asserted high to pull the OUT signal low. The PDRIVE signal is asserted high and the NDRIVE signal is asserted low to tri-state the OUT signal. The logic is configured to ensure that the PDRIVE signal is not asserted low while the NDRIVE signal is asserted high. The P path DC detection and correction circuits 215 ensure that the INP_AC and INN_AC signals do not stay in the incorrect logic state for any length of time, such as during initialization or during inactive periods. The P path DC detection and correction circuits 215 further minimize high currents and potential damage if the PDRIVE and NDRIVE signals are incorrectly asserted low and high, respectively, by correcting the states of INP_AC and INPB_AC.

In summary, input stage 201 and the I/O pre-driver 205 are both implemented entirely with thin-gate devices even though capable of switching the PDRIVE and NDRIVE signals at a relatively large voltage differential (3.3V or more). The devices on the P-channel side are biased by GVSS, which is 2.6V in the embodiment shown. In this manner, even if GVDD is at the higher voltage level of 3.3V, the voltage across the devices of the P path 503 is limited to a differential voltage suitable for thin-gate devices. The voltage levels of the GVDD and GVSS signals are scaled appropriately for different supply voltage levels to ensure that the voltage across the thin-gate devices are maintained within safe operating levels.

It is appreciated by those skilled in the art that the speed of the output buffer 200 is exceedingly fast from IN to OUT. The input stage 201 comprises the relatively small and fast thin-gate devices. The capacitors 209 and 213 transfer the signal to the I/O pre-driver 205 very quickly, which is also very fast since including only fast thin-gate devices. The output stage 207 is relatively fast and only includes thick-gate devices isolating the output node from the remaining thin-gate P-channel and N-channel devices. The speed from IN to OUT is on the order of 150 ps or less, which is significantly faster than conventional output buffer configurations. Yet all of the thin-gate devices are kept within suitable differential voltages to ensure safe operation.

Figure 6:
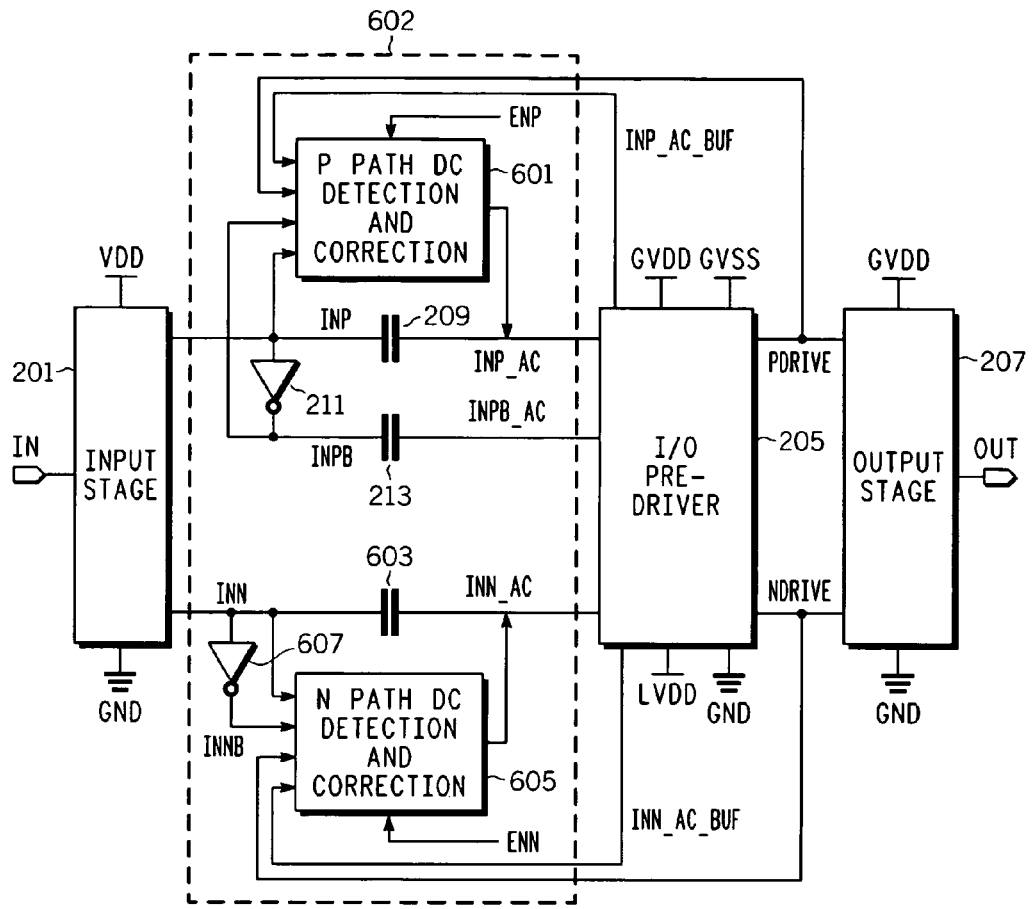
FIG. 6 is a schematic and block diagram of an output buffer implemented according to another exemplary embodiment of the present invention including feedback DC level detection and correction.

FIG. 6 is a schematic and block diagram of an output buffer 600 implemented according to another exemplary embodiment of the present invention including feedback DC level detection and correction. The output buffer 600 includes similar components as the output buffer 200, where such similar components are provided with identical reference numerals. The input stage 201, the I/O driver 205 and the output stage 207 are included and are configured to operate in substantially the same manner as the output buffer 200. The AC interface 203 is replaced with an AC interface 602, which includes the capacitors 209 and 213 and the inverter 211 configured and coupled in the same manner. The P path DC detection and correction circuits 215 are replaced by a single P path DC detection and correction circuit 601 coupled across the capacitor 209. The N path level shift circuit 208 is replaced by a capacitor 603, which receives the N path signal INN at one terminal and provides the INN_AC at its other terminal. An N path DC detection and correction circuit 605 is coupled across the capacitor 603. Another inverter 607 is including having its input receiving the INN signal and an output providing a signal INNB, which is an inverted version of INN. The P path DC detection and correction circuit 601 receives the INP, INPB, INP_AC_BUF and PDRIVE signals and adjusts the state of the INP_AC signal as necessary. Also, an enable signal ENP is provided to enable or disable the P path DC detection and correction circuit 601 as desired. The N path DC detection and correction circuit 605 receives the INN, INNB, INN_AC_BUF and NDRIVE signals and adjusts the state of the INN_AC signal as necessary. And an enable signal ENN is provided to enable or disable the N path DC detection and correction circuit 605 as desired.

It is appreciated by those skilled in the art that the speed of the output buffer 600 is also exceedingly fast from IN to OUT. The input stage 201 comprises the relatively small and fast thin-gate devices. The capacitors 209, 213 and 603 transfer the signal to the I/O pre-driver 205 very quickly, which is also very fast since including only fast thin-gate devices. The output stage 207 is relatively fast and only includes thick-gate devices isolating the output node from the remaining thin-gate P-channel and N-channel devices. The speed from IN to OUT is on the order of 150 ps or less, which is significantly faster than conventional output buffer configurations.

Figure 7:
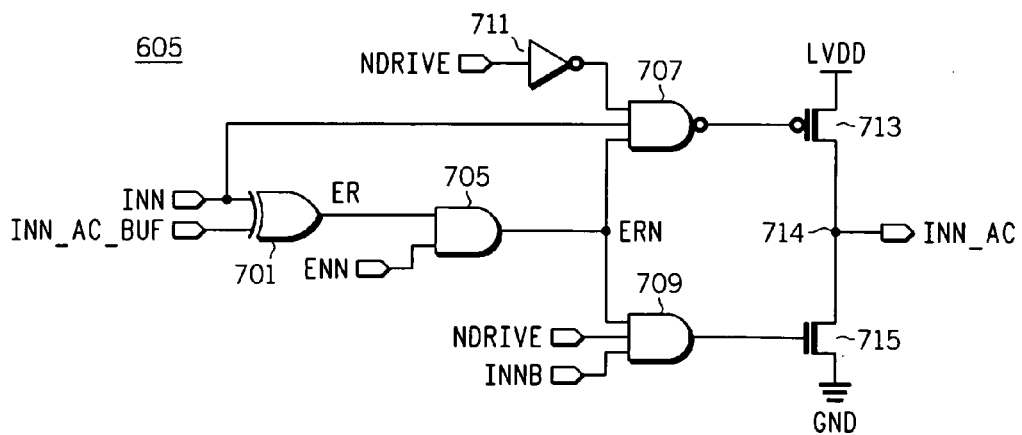
FIG. 7 is a schematic diagram of the N path DC detection and correction circuit of FIG. 6 implemented according to an exemplary embodiment of the present invention.

FIG. 7 is a schematic diagram of the N path DC detection and correction circuit 605 implemented according to an exemplary embodiment of the present invention. The INN and INN_AC_BUF signals are provided to the two inputs of a 2-input exclusive-OR (XOR) gate 701, having an output generating an error signal ER. The ER and ENN signals are provided to the two inputs of a 2-input AND gate 705, having an output providing an error signal ERN. The ERN signal is provided to one input of a 3-input NAND gate 707 and to one input of a 3-input AND gate 709. The INNB and NDRIVE signals are provided to the other two inputs of the AND gate 709. The NDRIVE signal is provided to the input of an inverter 711, having its output coupled to a second input of the NAND gate 707, having its third input receiving the INN signal. The output of the NAND gate 707 is coupled to the gate of a P-channel transistor 713, having a source coupled to LVDD and a drain coupled to a node 714, which is coupled to the terminal of the capacitor 603 that develops the INN_AC signal. The output of the AND gate 709 is coupled to the gate of an N-channel transistor 715, having a source coupled to GND and a drain coupled to node 714.

In operation of the N path DC detection and correction circuit 605, if the ENN signal is asserted low, then the ERN signal is low and the N path DC detection and correction circuit 605 is disabled. When disabled, the transistors 713 and 715 are off tri-stating their electrodes at node 714. Thus, the INN_AC signal is driven instead by the remainder of the circuitry of the output buffer 600. When the ENN signal is asserted high, the N path DC detection and correction circuit 605 is enabled so that the ER signal passes as the ERN signal indicative of an error of the state of the INN_AC signal. In normal operation, the states of INN and INN_AC_BUF are the same so that ER and ERN are asserted low. During an error condition, the states of INN and INN_AC_BUF are different and the ERN signal is asserted high. If INN is also high, then INN_AC_BUF is low and the NDRIVE signal may also be erroneously asserted low. If so, then the output of the NAND gate 707 goes low turning on the transistor 713 pulling the INN_AC signal high. The INN_AC signal going high eventually causes the INN_AC_BUF and NDRIVE signals to go high thereby removing the error condition. Alternatively, if INN is low and INN_AC_BUF is high, then the NDRIVE signal may also be erroneously asserted high. If so, and if the INNB signal is also high, then the output of the AND gate 709 goes high turning on the transistor 715 pulling the INN_AC signal low. The INN_AC signal going low eventually causes the INN_AC_BUF and NDRIVE signals to go low thereby removing the error condition.

Figure 8:
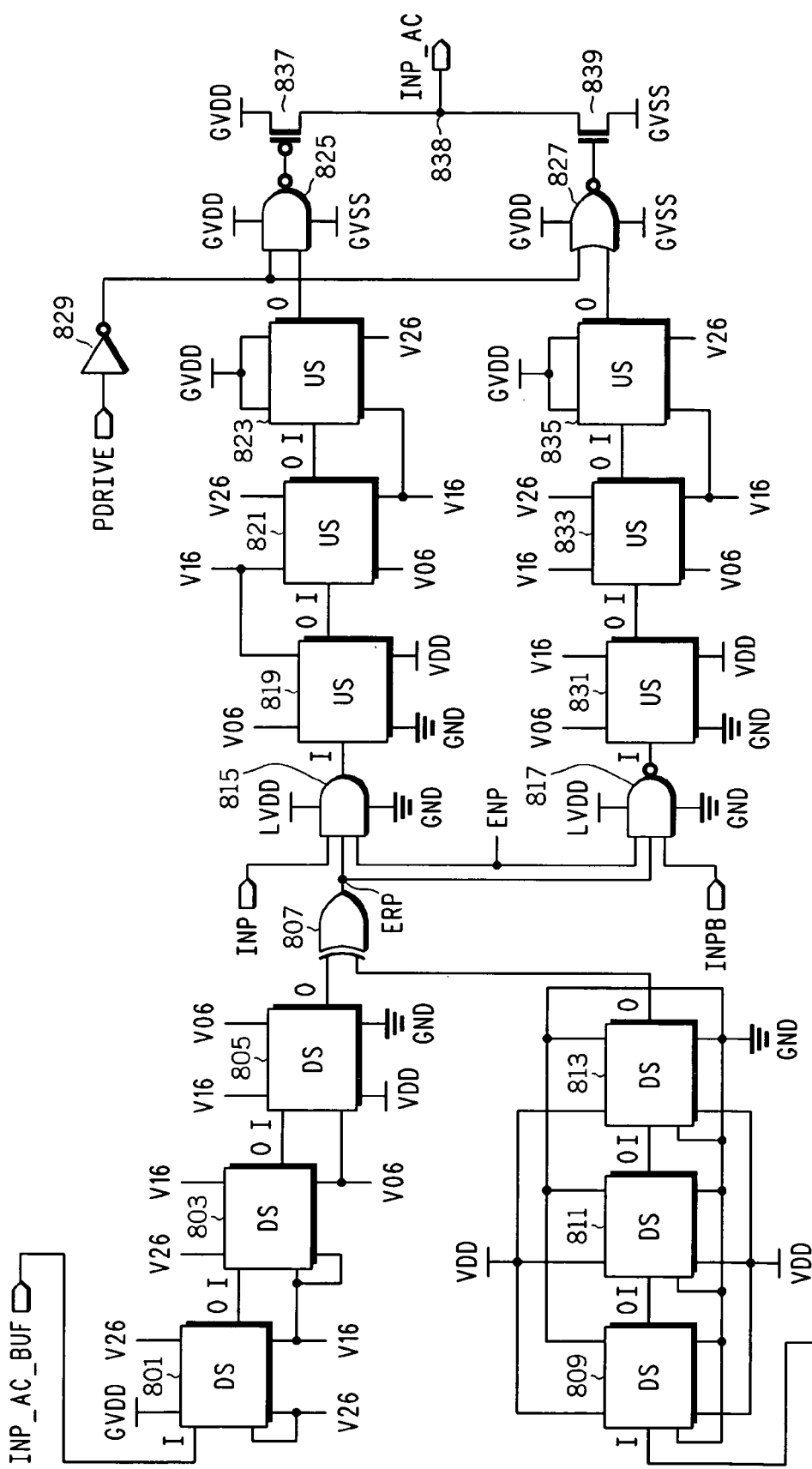
FIG. 8 is a schematic diagram of the P path DC detection and correction circuit of FIG. 6 implemented according to an exemplary embodiment of the present invention.

FIG. 8 is a schematic diagram of the P path DC detection and correction circuit 601 implemented according to an exemplary embodiment of the present invention. The INP_AC_BUF signal is provided through a series of down-shift (DS) circuits 801, 803 and 805 to one input of a 2-input XOR gate 807. The DS circuits 801–805 level shift the voltage of the INP_AC_BUF signal down from the GVDD/GVSS level to the VDD/GND level. Each DS circuit described herein includes an input labeled "I" and an output labeled "O" and several voltage reference inputs as shown. The reference voltages V26, V16 and another reference voltage V06 are used as shown, where V06 is scaled in a similar manner based on the voltage of GVDD. In one embodiment, for GVDD of 3.3V, V06 is 0.6V. The INP signal is provided through another series of DS circuits 809, 811 and 813 to the other input of the XOR gate 807. The DS circuits 809–813 are each configured in the same manner as the DS circuits 801–805, but do not actually level shift the INP signal but instead maintains its voltage level the same as the VDD signal. This is achieved by providing reference voltages of VDD and GND. Yet the DS circuits 809–813 provide the same delay as the DS circuits 801–805 to synchronize timing between the INP_AC_BUF and INP signals. The XOR gate 807 asserts an error signal ERP, which is provided to one input of a 3-input AND gate 815 and to one input of a 3-input NAND gate 817. The INP signal is provided to a second input of the AND gate 815 and the INPB signal is provided to a second input of the NAND gate 817. An enable signal ENP is provided to the third input of each of the AND and NAND gates 815, 817.

The output of the AND gate 815 is level-shifted up through a series of up shift (US) circuits 819, 821 and 823 to one input of a 2-input NAND gate 825, and the output of the NAND gate 817 is level-shifted up through another series of US circuits 831, 833 and 835 to one input of a 2-input NOR gate 827. Each US circuit described herein also includes an input labeled "I" and an output labeled "O" and several voltage reference inputs to achieve the desired voltage shift. The PDRIVE signal is provided to the input of an inverter 829, having its output coupled to the other input of the NAND gate 825 and to the other input of the NOR gate 827. The output of the NAND gate 825 is coupled to the gate of a P-channel transistor 837, having a source coupled to the GVDD signal and a drain coupled to a node 838, which is coupled to the terminal of the capacitor 209 that develops the INP_AC signal. The output of the NOR gate 827 is coupled to the gate of an N-channel transistor 839, having a source coupled to GVSS and a drain coupled to node 838.

In operation of the P path DC detection and correction circuit 601, if the ENP signal is asserted low, then the P path DC detection and correction circuit 601 is disabled since the output of the NAND gate 825 is kept high and the output of the NOR gate 827 is kept low. When disabled, the transistors 837 and 839 are kept off thus tri-stating the node 838. When the ENP signal is asserted high, the P path DC detection and correction circuit 601 is enabled to allow the state of the ERP signal to indicate an error of the state of the INP_AC signal. In normal operation, the states of INP and INP_AC_BUF are the same so that ERP signal is asserted low. During an error condition, the states of INP and INP_AC_BUF are different, so that the ERP signal is asserted high as a function of the XOR gate 807. If INP is also high, then the INP_AC_BUF signal is low and the PDRIVE signal may also be erroneously asserted low. If so, then the output of the AND gate 815 goes high and the output of the NAND gate 825 goes low turning on the transistor 837 pulling the INP_AC signal high. The INP_AC signal going high eventually causes the INP_AC_BUF and PDRIVE signals to go high thereby removing the error condition. Alternatively, if INP is low and INP_AC_BUF is high, then the PDRIVE signal may also be erroneously asserted high. If so, since the INPB signal is also high, the output of the NAND gate 817 goes low and the output of the NOR gate 827 goes high turning on the transistor 839 pulling the INP_AC signal low. The INP_AC signal going low eventually causes the INP_AC_BUF and PDRIVE signals to go low thereby removing the error condition.

The speed of the P path DC detection and correction circuit 601 is not critical since only detecting and correcting DC state of the AC signals if for any reason they are asserted to the incorrect state. Note, however, that the DS circuits 801–805 and 809–813 and the US circuits 819–823 and 831–835, which themselves are implemented with thin-gate devices, enable the entire P path DC detection and correction circuit 601 to also be implemented with thin-gate devices, which enhances speed to correct erroneous states in a fast and expedient manner.

FIG. 9 is a block diagram of an exemplary down shift or DS circuit 901 which may be used as any of the DS circuits 801–805 and 809–813. The DS circuit 901 receives a pair of upper voltage references VDDH and GNDH and a pair of low voltage references VDDL and GNDL, and a separate reference voltage VREF. The input I is level shifted from the voltage level of VDDH relative to GNDH down to the voltage level of VDDL relative to GNDL represented as the output signal O. For the DS circuit 801, for example, the input signal I is INP_AC_BUF, VDDH is GVDD, GNDH is V26, VREF and VDDL are each V26, and GNDL is V16 so that the input signal INP_AC_BUF is shifted from a maximum voltage level of GVDD down to a maximum voltage level of V26. FIG. 10 is a more detailed schematic diagram illustrating an embodiment of the DS circuit 901 implemented entirely with thin-gate devices.

FIG. 11 is a block diagram of an exemplary up shift or US circuit 1001 which may be used as any of the US circuits 819–823 and 831–835. The US circuit 1001 receives a pair of upper voltage references VREF and VDDH and a pair of low voltage references VDDL and GNDL. The input I is level shifted from the voltage level of VDDL relative to GNDL up to the voltage level of VDDH relative to VREF represented as the output signal O. For the US circuit 819, for example, the input signal I is the output of the AND gate 815, VREF is V06, VDDH is V16, GNDL is GND and VDDL is VDD, so that the input signal is shifted from a maximum voltage level of VDD up to a maximum voltage level of V16. FIG. 12 is a more detailed schematic diagram illustrating an embodiment of the US circuit 1001 implemented entirely with thin-gate devices.

In one aspect of the present invention, a high speed output buffer includes an input circuit, an AC interface, a DC detection and correction circuit, first and second drive circuits and an output circuit. The input circuit has an input receiving a digital input signal and first and second outputs providing first and second signals, which collectively represent the input signal and which operate within a first voltage range having a first common mode voltage. The AC interface has first and second inputs receiving the first and second signals, respectively, and has corresponding first and second outputs providing corresponding first and second preliminary drive signals in which the first preliminary drive signal is AC coupled to the first signal. The DC detection and correction circuit is operative to detect a state of the first signal and to correct a state of the first preliminary drive signal. The first and second drive circuits collectively have first and second inputs receiving the first and second preliminary drive signals, respectively, and have first and second outputs providing first and second drive signals, respectively.

The first drive circuit operates within a second voltage range having a second common mode voltage that is greater than the first common mode voltage and where the second drive circuit operates within a third voltage range. The first, second and third voltage ranges are each within a maximum voltage range suitable for a single thin-gate device. The output circuit has first and second inputs receiving the first and second drive signals, respectively, and has an output that switches an output node within a fourth voltage range that is greater than the maximum voltage range. In this manner, the AC coupling of the first signal to the first preliminary drive signal provides a fast transition to the first drive circuit, which operates within a second voltage range having a common mode voltage that is greater than the common mode voltage range of the input circuit. Nonetheless, the second voltage range is within a maximum voltage range suitable for a single thin-gate device, so that both first and second drive circuits may be implemented with thin-gate devices (e.g., thin-gate transistors and the like). And yet the first and second drive circuits drive the output circuit to switch the output node within a voltage range that is greater than the maximum voltage range suitable for a single thin-gate device. Thus, the circuit is optimized by using thin-gate devices for speed while enabling switching of a larger voltage signal. Since an AC interface may be indeterminate during initialization or after long periods of inactivity, the DC detection and correction circuit is operative to correct an erroneous state.

In one embodiment, the AC interface includes a capacitor having a first terminal receiving the first signal and a second terminal providing the first preliminary drive signal. The DC detection and correction circuit may include a thin-gate transistor and a resistive voltage divider circuit. The thin-gate transistor has a control electrode receiving the first signal, a first current electrode coupled to a first supply voltage within the first voltage range and a second current electrode. The resistive voltage divider circuit has a first terminal coupled to the second current electrode of the thin-gate transistor, a second terminal coupled to a second supply voltage within the second voltage range, and an intermediate terminal coupled to the second terminal of the first capacitor. In a programmable embodiment, a thick-gate transistor is included having a control electrode receiving an enable signal, a first current electrode coupled to the resistive voltage divider circuit and a second current electrode coupled to the second current electrode of the thin-gate transistor. The enable signal is asserted to scale the voltage level of the first drive circuit.

In another embodiment, the AC interface includes a capacitor having a first terminal receiving the first signal and a second terminal providing the first preliminary drive signal. The first drive circuit provides a buffered first preliminary drive signal being a buffered version of the first preliminary drive signal. The DC detection and correction circuit includes a logic circuit coupled to the capacitor and the first drive circuit that detects states of the first signal and the buffered first preliminary drive signal and that corrects a state of the first preliminary drive signal. In one more specific embodiment, the logic circuit includes a logic gate and a correction circuit. The logic gate has a first input receiving the first signal, a second input receiving the buffered first preliminary drive signal, and an output that asserts an error signal high when the first signal and the buffered first preliminary drive signal are in different states. The correction circuit has a first input receiving the first signal, a second input receiving the error signal and an output that changes a state of the first preliminary drive signal when the error signal is high. In another more specific embodiment, the correction circuit has a first input receiving the first signal, a second input receiving the error signal, a third input receiving the first drive signal, and an output that changes a state of the first preliminary drive signal when the error signal is high and when the first signal and first drive signal are in different states.

The AC interface may further include a capacitor having a first terminal receiving the second signal and a second terminal providing the second preliminary drive signal. The second drive circuit provides a buffered second preliminary drive signal being a buffered version of the second preliminary drive signal. The DC detection and correction circuit includes a logic circuit coupled to the capacitor and the second drive circuit that detects states of the second signal and of the buffered second preliminary drive signal and that corrects a state of the second preliminary drive signal.

In another aspect of the invention, a high speed output buffer includes an input stage, first and second interfaces, a first DC detection and correction circuit, first and second buildup circuits, and an output stage. The input stage has first and second outputs providing first and second signals, respectively, each switching between first and second supply voltages. The first interface has an input receiving the first signal and an output providing a first input drive signal that switches between the first supply voltage and a third supply voltage. The second interface includes an AC coupling and has an input receiving the second signal and an output providing a second input drive signal that switches between fourth and fifth supply voltages. The voltage differentials between the first and second supply voltages, between the first and third supply voltages, and a between the fourth and fifth supply voltages, are each within a maximum voltage differential suitable for a single thin-gate device. The first DC detection and correction circuit corrects a state of the second input drive signal if different from a state of the second signal. The first buildup circuit has an input receiving the first input drive signal and an output providing a first output drive signal that switches between the first and third supply voltages. The second buildup circuit has an input receiving the second input drive signal and an output providing a second output drive signal that switches between the fourth and fifth supply voltages. The output stage has first and second inputs receiving the first and second drive signals, respectively, and an output that switches between the first and fifth supply voltages having a voltage differential that is greater than the maximum voltage differential and that is not suitable for a single thin-gate device.

The first and second interfaces may each include capacitors. A second detection and correction circuit may be included to correct a state of the first input drive signal if different from a state of the first signal.

A method of level-shifting and buffering a signal according to an embodiment of the present invention includes logically converting an input signal to first and second signals collectively indicative of the input signal, operating the first and second signals between a lower first supply voltage and a second supply voltage that is greater than the first supply voltage, where the first and second supply voltages collectively define a first voltage differential that is within a maximum voltage level suitable for thin-gate devices, building up the second signal to a second drive signal within the maximum voltage level, receiving a third supply voltage that is greater than the second supply voltage and which defines a second voltage differential relative to the first supply voltage, wherein the second voltage differential is greater than the maximum voltage level, receiving a fourth supply voltage that is less than the third supply voltage, where the third and fourth supply voltages define a third voltage differential that is within the maximum voltage level, AC coupling the first signal to provide a first preliminary drive signal and level shifting the first preliminary drive signal to the third supply voltage and operative within the third voltage differential, building up the first preliminary drive signal to a first drive signal within the third voltage differential, and driving an output stage with the first and second drive signals to switch an output node between the first and third supply voltages.

The method may include detecting the states of the first signal and the first preliminary drive signal and correcting the state of the first preliminary drive signal if different from the state of the first signal. The method may include detecting the states of the first signal, the first preliminary drive signal, and the first drive signal and correcting the state of the first preliminary drive signal if different from the state of the first signal and if the first drive signal is in an incorrect state. The method may include AC coupling the second signal to provide a second preliminary drive signal, and detecting the states of the second signal and the second preliminary drive signal and correcting the state of the second preliminary drive signal if different from the state of the first signal. The process of building up the first preliminary drive signal to a first drive signal within the third voltage differential may include scaling voltage levels to achieve speed matching optimization between the first and second drive signals.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A high speed output buffer, comprising:

an input circuit having an input receiving a digital input signal and first and second outputs providing first and second signals collectively representing said input signal, said first and second signals each operating within a first voltage range having a first common mode voltage;

an AC interface having first and second inputs receiving said first and second signals, respectively, and having corresponding first and second outputs providing corresponding first and second preliminary drive signals in which said first preliminary drive signal is AC coupled to said first signal;

a DC detection and correction circuit that is operative to detect a state of said first signal and to correct a state of said first preliminary drive signal;

first and second drive circuits having first and second inputs receiving said first and second preliminary drive signals, respectively, and having first and second outputs providing first and second drive signals, respectively;

wherein said first drive circuit operates within a second voltage range having a second common mode voltage that is greater than said first common mode voltage and wherein said second drive circuit operates within a third voltage range;

wherein said first, second and third voltage ranges are each within a maximum voltage range suitable for a single thin-gate device; and an output circuit having first and second inputs receiving said first and second drive signals, respectively, and having an output that switches an output node within a fourth voltage range that is greater than said maximum voltage range.

2. The high speed output buffer of claim 1, wherein said input circuit and said first and second drive circuits are each implemented with thin-gate transistors.

3. The high speed output buffer of claim 1, wherein said AC interface comprises a first capacitor having a first terminal receiving said first signal and a second terminal providing said first preliminary drive signal.

4. The high speed output buffer of claim 3, wherein said DC detection and correction circuit comprises:

a first thin-gate transistor having a control electrode receiving said first signal, a first current electrode coupled to a first supply voltage within said first voltage range and a second current electrode; and a first resistive voltage divider circuit having a first terminal coupled to said second current electrode of said first thin-gate transistor, a second terminal coupled to a second supply voltage within said second voltage range, and an intermediate terminal coupled to said second terminal of said first capacitor.

5. The high speed output buffer of claim 4, further comprising a thick-gate transistor having a control electrode receiving an enable signal, a first current electrode coupled to said first resistive voltage divider circuit and a second current electrode coupled to said second current electrode of said first thin-gate transistor.

6. The high speed output buffer of claim 1, wherein:

said AC interface comprises a capacitor having a first terminal receiving said first signal and a second terminal providing said first preliminary drive signal;

wherein said first drive circuit provides a buffered first preliminary drive signal being a buffered version of said first preliminary drive signal; and wherein said DC detection and correction circuit comprises a logic circuit coupled to said capacitor and said first drive circuit that detects states of said first signal and said buffered first preliminary drive signal and that corrects a state of said first preliminary drive signal.

7. The high speed output buffer of claim 6, wherein said logic circuit comprises:

a logic gate having a first input receiving said first signal, a second input receiving said buffered first preliminary drive signal, and an output that asserts an error signal high when said first signal and said buffered first preliminary drive signal are in different states; and a correction circuit having a first input receiving said first signal, a second input receiving said error signal and an output that changes a state of said first preliminary drive signal when said error signal is high.

8. The high speed output buffer of claim 6, wherein said logic circuit comprises:

a logic gate having a first input receiving said first signal, a second input receiving said buffered first preliminary drive signal, and an output that asserts an error signal high when said first signal and said buffered first preliminary drive signal are in different states; and a correction circuit having a first input receiving said first signal, a second input receiving said error signal, a third input receiving said first drive signal, and an output that changes a state of said first preliminary drive signal when said error signal is high and when said first signal and first drive signal are in different states.

9. The high speed output buffer of claim 1, wherein:

said AC interface comprises a capacitor having a first terminal receiving said second signal and a second terminal providing said second preliminary drive signal;

wherein said second drive circuit provides a buffered second preliminary drive signal being a buffered version of said second preliminary drive signal; and wherein said DC detection and correction circuit comprises a logic circuit coupled to said capacitor and said second drive circuit that detects states of said second signal and of said buffered second preliminary drive signal and that corrects a state of said second preliminary drive signal.

10. The high speed output buffer of claim 1, wherein said output circuit comprises:

a first cascode stack comprising:

a first thin-gate P-channel transistor having a gate receiving said first drive signal, a source coupled to a first supply voltage within said second voltage range and a drain;

a second thin-gate P-channel transistor having a gate receiving a first reference voltage, a source coupled to said drain of said first thin-gate P-channel transistor, and a drain; and a thick-gate P-channel transistor having a gate receiving a second reference voltage, a source coupled to said drain of said second thin-gate P-channel transistor, and a drain coupled to said output node; and a second cascode stack comprising:

a thick-gate N-channel transistor having a gate receiving a third reference voltage, a drain coupled to said output node, and a source;

a first thin-gate N-channel transistor having a gate receiving a fourth reference voltage, a drain coupled to said source of said thick-gate P-channel transistor, and a source; and a second thin-gate N-channel transistor having a gate receiving said second drive signal, a source coupled to a second supply voltage within said third voltage range, and a drain coupled to said source of said first thin-gate N-channel transistor;

wherein said first, second, third, and fourth reference voltages are scaled to protect said first and second thin-gate P-channel transistors and said first and second thin-gate N-channel transistors.

11. A high speed output buffer, comprising:

an input stage having first and second outputs providing first and second signals, respectively, each switching between first and second supply voltages;

a first interface having an input receiving said first signal and an output providing a first input drive signal that switches between said first supply voltage and a third supply voltage;

a second interface comprising an AC coupling and having an input receiving said second signal and an output providing a second input drive signal that switches between fourth and fifth supply voltages;

wherein voltage differentials between said first and second supply voltages, between said first and third supply voltages, and between said fourth and fifth supply voltages, are each within a maximum voltage differential suitable for a single thin-gate device;

a first DC detection and correction circuit that corrects a state of said second input drive signal if different from a state of said second signal;

a first buildup circuit having an input receiving said first input drive signal and an output providing a first output drive signal that switches between said first and third supply voltages, and a second buildup circuit having an input receiving said second input drive signal and an output providing a second output drive signal that switches between said fourth and fifth supply voltages; and an output stage having first and second inputs receiving said first and second drive signals, respectively, and an output that switches between said first and fifth supply voltages having a voltage differential that is greater than said maximum voltage differential and that is not suitable for a single thin-gate device.

12. The high speed output buffer of claim 11, wherein:

said second interface comprises a capacitor having a first terminal receiving said second signal and a second terminal providing said second input drive signal;

wherein said second buildup circuit comprises a buffer receiving said second input drive signal and an output providing a buffered second input drive signal; and wherein said first DC detection and correction circuit comprises:

a first logic circuit that provides an error signal if said buffered second input drive signal and said second signal are in different states; and a second logic circuit that switches said second input drive signal if said error signal is provided and if said second output drive signal is in an incorrect state.

13. The high speed output buffer of claim 12, wherein said first logic circuit comprises:

a down level shift circuit having an input receiving said buffered second input drive signal and an output providing a level-shifted buffered second input drive signal;

a delay circuit having an input that receives said second signal and an output that provides a delayed second signal; and a logic gate having a first input receiving said level-shifted buffered second input drive signal, a second input receiving said delayed second signal, and an output providing said error signal.

14. The high speed output buffer of claim 12, wherein said second logic circuit comprises:

a first inverter having a first input receiving said second input drive signal and an output providing an inverted second input drive signal;

a second inverter having an input receiving said second output drive signal and an output providing an inverted second output drive signal;

an AND gate having a first input receiving said error signal, a second input receiving said first signal and an output providing a pull up signal;

a first up level shift circuit having an input receiving said pull up signal and an output providing a level-shifted pull up signal;

a first inverting logic gate having a first input receiving said level-shifted pull up signal, a second input receiving said inverted second output drive signal, and an output;

a pull up switch having a first current electrode coupled to said fifth supply voltage, a second current electrode coupled to drive said second input drive signal, and a control electrode coupled to said output of said first inverting logic gate;

a NAND gate having a first input receiving said error signal, a second input receiving said inverted second input drive signal and an output providing a pull down signal;

a second up level shift circuit having an input receiving said pull down signal and an output providing a level-shifted pull down signal;

a second inverting logic gate having a first input receiving said level-shifted pull down signal, a second input receiving said inverted second output drive signal and an output; and a pull down switch having a first current electrode coupled to said fourth supply voltage, a second current electrode coupled to drive said second input drive signal, and a control electrode coupled to said output of said second inverting logic gate.

15. The high speed output buffer of claim 11, further comprising:

said first interface comprising a capacitor having a first terminal receiving said first signal and a second terminal providing said first input drive signal; and a second DC detection and correction circuit that corrects a state of said first input drive signal if different from a state of said first signal.

16. A method of level-shifting and buffering a signal, comprising:

- logically converting an input signal to first and second signals collectively indicative of the input signal;
- operating the first and second signals between a first supply voltage and a second supply voltage that is greater than the first supply voltage, wherein the first and second supply voltages collectively define a first voltage differential that is within a maximum voltage level suitable for thin-gate devices;
- building up the second signal to a second drive signal within the maximum voltage level;
- receiving a third supply voltage that is greater than the second supply voltage and which defines a second voltage differential relative to the first supply voltage, wherein the second voltage differential is greater than the maximum voltage level;
- receiving a fourth supply voltage that is less than the third supply voltage, wherein the third and fourth supply voltages define a third voltage differential that is within the maximum voltage level;
- AC coupling the first signal to provide a first preliminary drive signal and level shifting the first preliminary drive signal to the third supply voltage and operative within the third voltage differential;
- building up the first preliminary drive signal to a first drive signal within the third voltage differential; and
- driving an output stage with the first and second drive signals to switch an output node between the first and third supply voltages.

17. The method of claim 16, further comprising detecting the states of the first signal and the first preliminary drive signal and correcting the state of the first preliminary drive signal if different from the state of the first signal.

18. The method of claim 16, further comprising detecting the states of the first signal, the first preliminary drive signal, and the first drive signal and correcting the state of the first preliminary drive signal if different from the state of the first signal and if the first drive signal is in an incorrect state.

19. The method of claim 16, further comprising:

- AC coupling the second signal to provide a second preliminary drive signal; and
- detecting the states of the second signal and the second preliminary drive signal and correcting the state of the second preliminary drive signal if different from the state of the first signal.

20. The method of claim 16, wherein said building up the first preliminary drive signal to a first drive signal within the third voltage differential comprises scaling voltage levels to achieve speed matching optimization between the first and second drive signals.

* * * * *